US006562686B2

(12) United States Patent
Lee

(10) Patent No.: US 6,562,686 B2
(45) Date of Patent: May 13, 2003

(54) METHOD FOR FABRICATING SEMICONDUCTOR DEVICE

(75) Inventor: Hi Deok Lee, Chungcheungbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/083,187

(22) Filed: Feb. 26, 2002

(65) Prior Publication Data

US 2002/0140029 A1 Oct. 3, 2002

(30) Foreign Application Priority Data

Mar. 29, 2001 (KR) ........................................ 2001-16532

(51) Int. Cl.$^7$ ............................................ H01L 21/336
(52) U.S. Cl. ........................ 438/301; 438/300; 438/306; 438/918
(58) Field of Search ................................ 438/231–232, 438/301, 305–306, 918, 300

(56) References Cited

U.S. PATENT DOCUMENTS

| | | | |
|---|---|---|---|
| 5,841,173 A | | 11/1998 | Yamashita |
| 5,985,722 A | * | 11/1999 | Kishi ........................ 438/275 |
| 6,110,787 A | | 8/2000 | Chan et al. |
| 6,162,689 A | * | 12/2000 | Kepler et al. ............... 438/299 |
| 6,194,748 B1 | * | 2/2001 | Yu ............................. 257/216 |
| 6,238,989 B1 | | 5/2001 | Wc Huang et al. |
| 6,489,206 B2 | * | 12/2002 | Chen et al. ................. 257/344 |

OTHER PUBLICATIONS

United Kingdom Search Report dated Dec. 10, 2002 (2 pages).

* cited by examiner

Primary Examiner—Amir Zarabian
Assistant Examiner—Jamie L. Brophy
(74) Attorney, Agent, or Firm—Marshall, Gerstein & Borun

(57) ABSTRACT

A method for fabricating a semiconductor device employing a salicide (self-aligned silicide) structure is disclosed. The method prevents a junction leakage current from being increased at a portion of a source/drain region which is adjacent to an field oxide, by forming the source/drain region comprised of a relatively deep SID region and a relatively shallow SID region, wherein the deep SID region is formed adjacent to the field oxide and the shallow SID region is formed adjacent to the insulating film spacer. The method comprises the steps of forming a field oxide in a semiconductor substrate, forming a gate oxide and a gate electrode on the semiconductor substrate, forming an LDD region in the semiconductor substrate along a side of the gate electrode, forming a sidewall spacer on each sidewall of the gate electrode, forming a protection layer pattern covering the field oxide and a portion of the LDD region, forming a SEG layer where the protection layer pattern is not covered, removing the protection layer pattern to expose the portion of the LDD region, forming a source/drain region comprised of a deep SID region and a shallow SID region, forming a silicide layer on the gate electrode, the SEG layer and the deep SID region.

10 Claims, 4 Drawing Sheets

METHOD FOR FABRICATING SEMICONDUCTOR DEVICE

BACKGROUND

1. Technical Field

A method for fabricating a semiconductor device is disclosed. In particular, an improved method for fabricating a high speed semiconductor device is disclosed where the device includes a salicide. In the disclosed method, a shallow and a deep source/drain region are formed simultaneously by forming an insulating film spacer on sidewalls of a gate electrode, forming SEG (selective epitaxial growth) layer in the LDD (lightly doped drain) region adjacent to the insulating film spacer, and then performing an ion implanting process.

2. Description of the Related Art

In general, the most important function of a transistor of a semiconductor circuit is a current driving function. A channel width of a metal-oxide-semiconductor field effect transistor (MOSFET) is adjusted in consideration of the current driving function. In the most widely-used MOSFET, an impurity-doped polysilicon layer is used as a gate electrode, and a diffusion region formed by doping an impurity on a semiconductor substrate is used as a source/drain region.

A buried channel is formed in a P-type-semiconductor field effect transistor (PMOSFET) which uses an N+ doped polysilicon gate electrode in a complementary metal-oxide-semiconductor field effect transistor (CMOSFET). Here, because a N-type-semiconductor field effect transistor (NMOSFET) having a channel on its surface and the PMOSFET have different threshold voltages, there are various restrictions in design and fabrication of the device.

That is, in the CMOSFET using a dual gate electrode, the dual gate electrodes are formed by ion-implanting N-type and P-type impurities twice. Therefore, a photolithography process should be performed twice, and this complicates the fabrication process. Accordingly, the device can be easily contaminated due to a wet process, and thus the process yield and reliability thereof are reduced.

In addition, as the sizes of semiconductor devices becomes smaller, the junction depth becomes shallower. However, in high speed devices, large leakage current occurs due to the salicide process in which silicide layers are formed on the source/drain region and the gate electrode.

FIGS. 1A through 1C are cross-sectional diagrams illustrating sequential steps of a conventional method for fabricating a semiconductor device.

First, referring to FIG. 1A, a field oxide 11 defining an active region is formed on a semiconductor substrate 10. A gate oxide 12 and a polysilicon layer (not shown) are formed on the semiconductor substrate 10. Thereafter, the polysilicon layer is etched using a gate electrode mask as an etching mask, to form a gate electrode 13. An LDD region 14 is formed by ion-implanting a low concentration impurity to the semiconductor substrate 10 at both sides of or around the gate electrode 13. An insulating film spacer 15 is formed on side walls of the gate electrode 13.

As shown in FIG. 1B, a first source/drain region 16 is formed by ion-implanting a high concentration impurity to the semiconductor substrate 10 at both sides of or around the insulating film spacer 15. Here, As is ion-implanted for a NMOS, and $B_{11}$ for a PMOS.

Thereafter, still referring to FIG. 1B, a second source/drain region 17 is formed by implanting a dopant having a high diffusion ratio at a low dose. Here, Ph is ion-implanted instead of As for a NMOS, and $B_{11}$ instead of $BF_2$ for a PMOS.

As seen in FIG. 1C, a silicide layer 18 is formed on the surfaces of the gate electrode 13, the first source/drain region 16 and the second source/drain region 17.

However, the conventional method for fabricating the semiconductor device has a limit due to shallow junction region resulting from miniaturization of the device. Therefore, increase in the depth of the junction region due to the ion implant process for forming the silicide layer 18 influences the LDD region 14. Especially, when the silicide layer 18 is formed deeply along the rim of the field oxide layer 11, leakage current increases considerably in the junction region of the field oxide 11 and the height of the field oxide 11 is decreased during subsequent processes. In addition, in case of a borderless contact, since the contact is formed along the rim of the field oxide 11, leakage current drastically increases in the junction region of peripheral circuit region.

SUMMARY OF THE DISCLOSURE

Accordingly, a method for fabricating a semiconductor device is disclosed which can prevent increase in a junction leakage current and improve a process yield and reliability, by forming a protection film along the rim of the field oxide, forming a SEG layer on the source/drain region, removing the protection film and ion-implanting to form a deep junction in the source/drain region. As a result, the region where the protection film has a deeper junction than the region where the SEG layer is so the ion-implant process has no negative effect on the channel region of CMOS device.

A disclosed method for fabricating a semiconductor device comprises: forming an field oxide defining a active region in a semiconductor substrate; forming a gate oxide and a gate electrode on the active region of the semiconductor substrate; forming an LDD region by ion-implanting low concentration impurities in the semiconductor substrate at both sides of or around the gate electrode; forming an insulating film spacer on each sidewall of the gate electrode; forming a protection film pattern exposing the gate electrode, the insulating film spacer and a portion of the active region of the semiconductor substrate adjacent to the insulating film spacer; forming a SEG layer on the exposed portion of the active region of the semiconductor substrate; removing the protection film pattern; forming a source/drain region comprising a shallow highly dopes source/drain region ("shallow SID region") and a deep highly doped source/drain region ("deep SID region") by ion-implanting high concentration impurities, wherein the shallow SID region is formed beneath the SEG layer and the deep SID region is formed at the exposed active region adjacent to the field oxide where the SEG layer is not formed; forming a silicide layer on the gate electrode, the SEG layer and the active region of the semiconductor substrate.

The protection film pattern may be formed of one or more films selected from a group of silicon oxide film, silicon nitride film, silicon oxynitride film and combinations thereof.

The protection film pattern leaves an exposed portion of the LDD region ranging from about 0.01 to about 1 μm away from the insulating film spacer.

The SEG layer may have a thickness ranging from about 0.01 to about 0.5 μm.

The SEG layer may be a single crystal layer, an amorphous silicon layer or a phosphorous silicon layer.

A novel semiconductor device made in accordance with the disclosed methods is also disclosed.

BRIEF DESCRIPTION OF THE DRAWINGS

The disclosed methods will become better understood with reference to the accompanying drawings which are given only by way of illustration and thus are not limitative of the disclosure.

DETAILED DESCRIPTION OF THE PRESENTLY PREFERRED EMBODIMENTS

A method for fabricating a semiconductor device in accordance with preferred embodiments will now be described in detail with reference to the accompanying drawings.

FIGS. 2A through 2D are cross-sectional views illustrating sequential steps of a method for fabricating a semiconductor device in accordance with a first embodiment. A NMOS region or a PMOS region of a CMOS is shown.

Figure 1A:
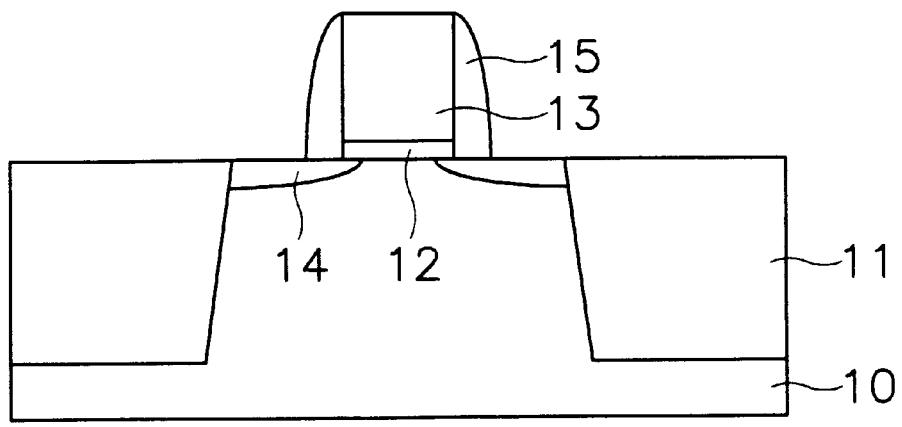
FIGS. 1A through 1C are cross-sectional views illustrating sequential steps of a conventional method for fabricating a semiconductor device.
Figure 1B:
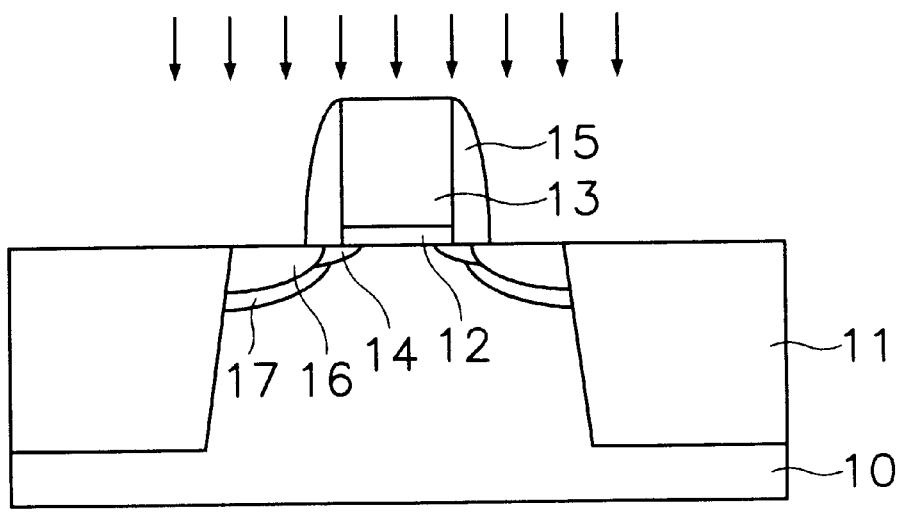
Figure 1C:
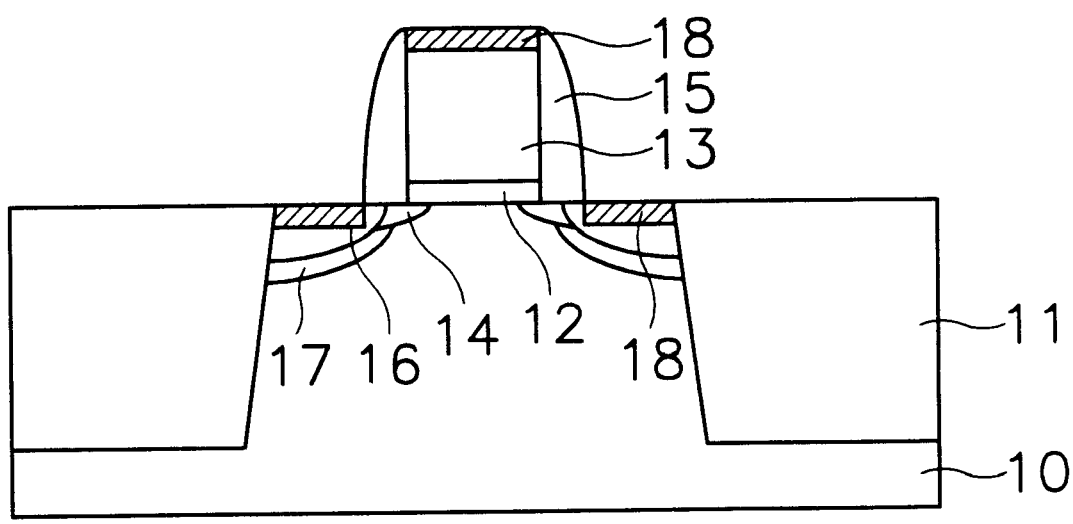
Figure 2A:
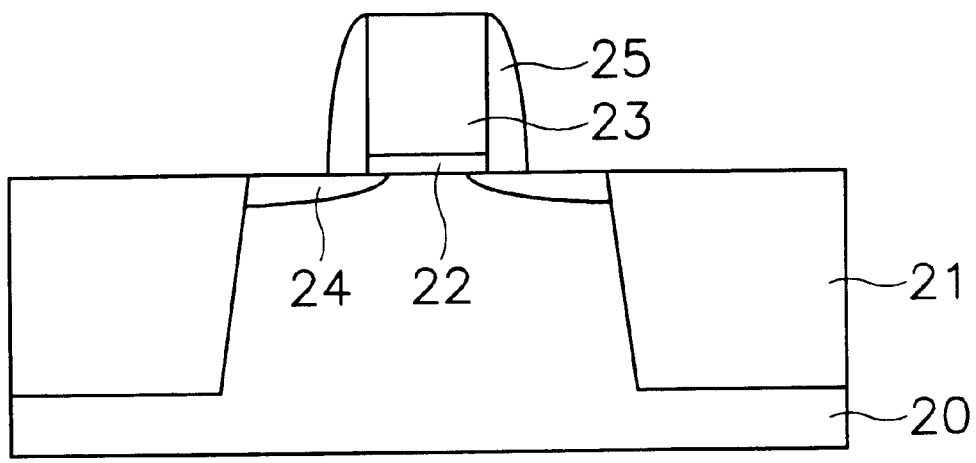
FIGS. 2A through 2D are cross-sectional views illustrating sequential steps of a method for fabricating a semiconductor device in accordance with a first embodiment.
Figure 2B:
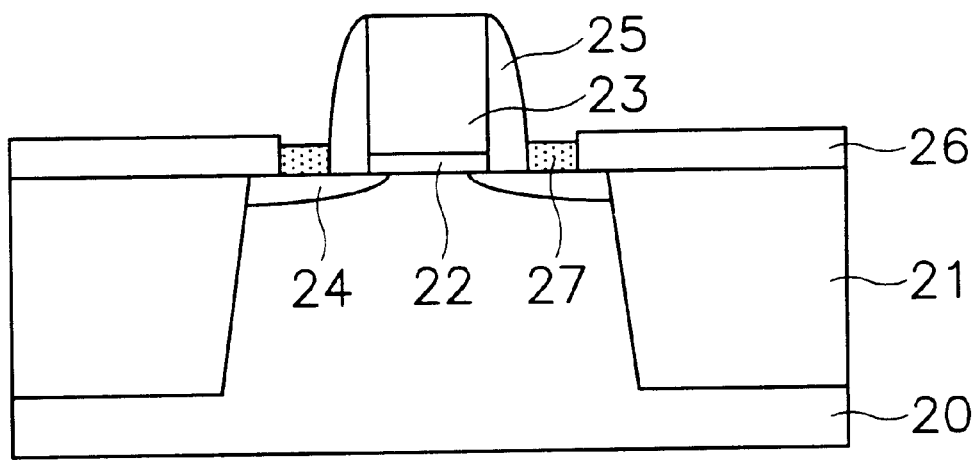

First, as shown in FIG. 2B, a field oxide 21 defining an active region is formed on a semiconductor substrate 20. A gate oxide 22 is formed on the semiconductor substrate 20. A polysilicon layer (not shown) is formed on the gate oxide 22. Here, the gate oxide 22 and the polysilicon layer are formed in the NMOS and PMOS regions.

Thereafter, the polysilicon layer is etched using a gate electrode mask as an etching mask, to form a gate electrode 23 in the NMOS and PMOS regions. A first LDD region 24 is formed by ion-implanting a low concentration impurity ions to the semiconductor substrate 20 at both sides of or around the gate electrode 23. At this time, the ion implant process is performed at a dose ranging from about $1 \times 10^{13}$ to about $1 \times 10^{15}$ ions/cm$^2$ with an ion implant energy ranging from about 10 to about 50 keV. The dopants used in the ion-implanting process are BF$_2$ or B for a PMOS and As or P for an NMOS.

Then, an insulation film (not shown) with a predetermined thickness is formed on the whole surface. An insulation film spacer 25 is formed on the side walls of the gate electrode 23 by etching the insulation film.

Next, a protection film (not shown) with a predetermined thickness is formed on the whole surface. The protection film is formed of one or more of a silicon oxide film, a silicon nitride film or a silicon oxynitride film.

Then, as shown in FIG. 2B, a protection film pattern 26 is formed from the protection film by an etching process using a mask which exposes the gate electrode 23, the insulation film spacer 25, and the LDD region 24 so the protection film pattern 26 terminates at a predetermined distance away from the insulation film spacer 25. At this time, the protection film pattern 26 a portion of exposes a portion of the LDD region 24 defined by a distance ranging from about 0.01 to about 1 μm away from the insulation film spacer 25.

Subsequently, still referring to FIG. 2B, SEG layer 27 is formed on the semiconductor substrate 20 and LDD region 24 exposed by the protection film pattern 26. The SEG layer 27 is formed using single crystal silicon layer, amorphous silicon layer or phosphorus silicon layer with a thickness ranging from about 0.01 to about 0.5 μm.

In addition, instead of a SEG layer 27, a single crystal silicon layer, an amorphous silicon layer or a phosphorus silicon layer formed by LPCVD (low pressure chemical vapor deposition) and patterned using mask can be used.

Figure 2C:
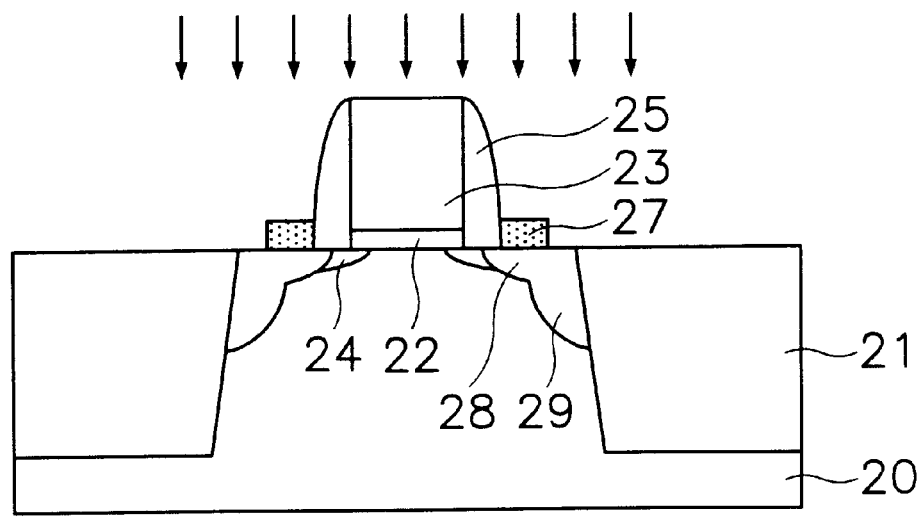

Next, as shown in FIG. 2C, the protection film pattern 26 is removed. Then, a source/drain region is formed by ion-implanting high concentration impurities. At this time, the source/drain region comprises a shallow SID region 28 formed where the SEG layer 27 is formed, and a deep SID region 29 formed at the inner rim of the field oxide 21 where the SEG layer 27 is not formed. The ion-implant process is performed at a dose ranging from about $1 \times 10^{13}$ to about $1 \times 10^{16}$ ions/cm$^2$ with an energy ranging from about 5 to about 60 KeV.

Figure 2D:
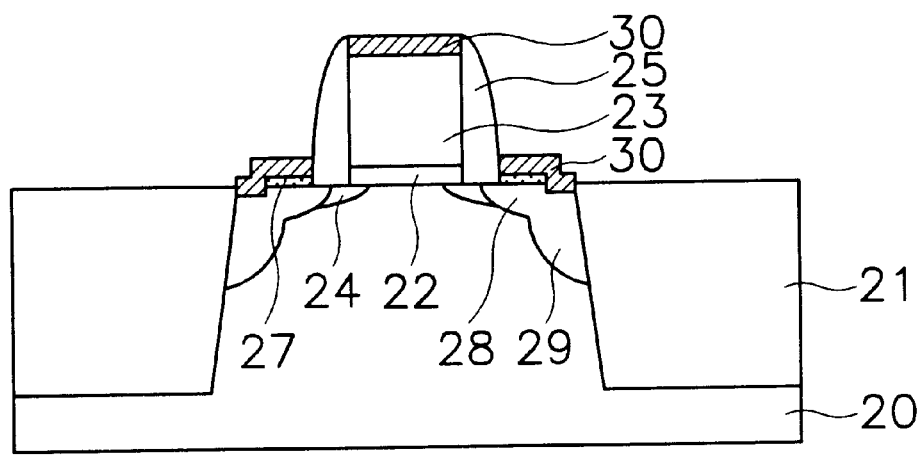

Subsequently, as shown in FIG. 2D, silicide layer 30 is formed on the upper portion of the gate electrode 23, the surface of the SEG layer 27 and the active region of the semiconductor substrate 20. Even when the silicide layer 30 is formed deeply at the rim of the field oxide 21, the junction leakage current is barely increased.

As described earlier, in the high speed device structure consisting of a self-aligned salicide, even when the silicide layer is formed deep into the SID region 29 of the substrate 10, junction leakage current can be prevented from increasing by forming deep SID region 29 at the rim of the field oxide 21, and during the ion-implanting process for forming SID regions 28, 29, the problem of dopants effecting the channel region can be overcome resulting in reduction of short channel effect. In addition, the area of the active region is increased by the SEG layer 27 to reduce the resistance of the silicide layer 30, thereby achieving reduction in size of the device and improving the operation speed of the device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed:

1. A method of fabricating a semiconductor device comprising:

forming a field oxide defining a active region on a semiconductor substrate;

forming a gate oxide and a gate electrode on the active region;

forming an LDD region by ion-implanting a low concentration impurities in the active region around the gate electrode;

forming an insulating film spacer on each sidewall of the gate electrode;

forming a protection film pattern exposing the gate electrode, the insulating film spacer and a portion of the active region adjacent to the insulating film spacer;

forming a SEG layer on part of the exposed portion of active region;

removing the protection film pattern;

forming a source/drain region comprising a shallow SID region and a deep SID region by ion-implanting a high concentration of impurities, wherein the shallow SID region is formed substantially beneath the SEG layer and the deep SID region is formed in the exposed portion of the substrate disposed between the field oxide and the SEG layer;

forming a silicide layer on the gate electrode, the SEG layer and between the SEG layer and the field oxide.

2. The method according the claim 1, wherein the protection film pattern comprise at least one film selected from a group consisting of silicon oxide film, silicon nitride film, silicon oxynitride film and combinations thereof.

3. The method according to claim 1, wherein the protection film pattern terminates a distance outside of the insulating film spacer ranging from about 0.01 to about 1 μm.

4. The method according to claim 1, wherein the SEG layer has a thickness ranging from about 0.01 to about 0.5 μm.

5. The method according to claim 1, wherein the SEG layer is selected from the group consisting of a single crystal layer, an amorphous silicon layer and a phosphorous silicon layer.

6. A method of fabricating a semiconductor device, comprising the steps of:

forming a field oxide layer defining a active region on a semiconductor substrate;

forming a gate oxide and a gate electrode on the active region;

forming an LDD region by ion-implanting a low concentration impurities in the active region around the gate electrode;

forming an insulating film spacer on a sidewall of the gate electrode;

forming a protection film pattern around and spaced laterally away from the gate electrode and the insulating film spacer so that the protection film pattern exposes a first portion of the active region disposed between the insulating film spacer and the field oxide layer;

forming a SEG layer on the first portion of the active region;

removing the protection film pattern so an additional portion of the active region disposed between the first portion and the field oxide layer is exposed;

forming a source/drain region comprising a shallow SID region and a deep SID region by ion-implanting a high concentration of impurities to the active region; and forming a silicide layer on the gate electrode, the SEG layer and the additional portion of the active region.

7. The method according the claim 6, wherein the protection film pattern comprise at least one film selected from a group consisting of silicon oxide film, silicon nitride film, silicon oxynitride film and combinations thereof.

8. The method according to claim 6, wherein the protection film pattern terminates at a distance outside of the insulating film spacer ranging from about 0.01 to about 1 μm.

9. The method according to claim 6, wherein the SEG layer has a thickness ranging from about 0.01 to about 0.5 μm.

10. The method according to claim 6, wherein the SEG layer is selected from the group consisting of a single crystal layer, an amorphous silicon layer and a phosphorous silicon layer.

* * * * *

UNITED STATES PATENT AND TRADEMARK OFFICE
CERTIFICATE OF CORRECTION

PATENT NO. : 6,562,686 B2
DATED : May 13, 2003
INVENTOR(S) : Hi Deok Lee

It is certified that error appears in the above-identified patent and that said Letters Patent is hereby corrected as shown below:

<u>Column 4,</u>
Line 47, please replace "a active" with -- an active --.

<u>Column 5,</u>
Line 21, please replace "a active" with -- an active --.

Signed and Sealed this

Twenty-third Day of September, 2003

JAMES E. ROGAN
*Director of the United States Patent and Trademark Office*